(12) United States Patent
Yang

(10) Patent No.: US 11,094,796 B2
(45) Date of Patent: Aug. 17, 2021

(54) TRANSISTOR SPACER STRUCTURES

(71) Applicant: TAIWAN SEMICONDUCTOR MANUFACTURING CO., LTD., Hsinchu (TW)

(72) Inventor: Chansyun David Yang, Shinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/690,441

(22) Filed: Nov. 21, 2019

(65) Prior Publication Data

US 2021/0098598 A1   Apr. 1, 2021

Related U.S. Application Data

(60) Provisional application No. 62/908,166, filed on Sep. 30, 2019.

(51) Int. Cl.
*H01L 29/66* (2006.01)
*H01L 29/78* (2006.01)
(Continued)

(52) U.S. Cl.
CPC .... *H01L 29/6656* (2013.01); *H01L 21/02126* (2013.01); *H01L 29/515* (2013.01);
(Continued)

(58) Field of Classification Search
CPC ............. H01L 29/6653; H01L 29/515; H01L 29/6656; H01L 21/02126; H01L 29/518
See application file for complete search history.

(56) References Cited

U.S. PATENT DOCUMENTS 6,180,988 B1   1/2001   Wu
8,637,930 B2   1/2014   Ando et al.
(Continued)

FOREIGN PATENT DOCUMENTS

DE   10 2012 217 491 A1   4/2013
DE   10 2017 126 049 A1   2/2019
(Continued)

OTHER PUBLICATIONS

Korean Office Action, dated Feb. 5, 2021, for Korean Intellectual Property Office Appl. No. 10-2020-0024957, 6 pages.
(Continued)

*Primary Examiner* — Savitri Mulpuri
(74) *Attorney, Agent, or Firm* — Sterne, Kessler, Goldstein & Fox P.L.L.C.

(57) ABSTRACT

The present disclosure describes a method for forming gate spacer structures with air-gaps to reduce the parasitic capacitance between the transistor's gate structures and the source/drain contacts. In some embodiments, the method includes forming a gate structure on a substrate and a spacer stack on sidewall surfaces of the gate structure—where the spacer stack comprises an inner spacer layer in contact with the gate structure, a sacrificial spacer layer on the inner spacer layer, and an outer spacer layer on the sacrificial spacer layer. The method further includes removing the sacrificial spacer layer to form an opening between the inner and outer spacer layers, depositing a polymer material on top surfaces of the inner and outer spacer layers, etching top sidewall surfaces of the inner and outer spacer layers to form a tapered top portion, and depositing a seal material.

20 Claims, 11 Drawing Sheets

(51) Int. Cl.
*H01L 21/02* (2006.01)
*H01L 29/51* (2006.01)

(52) U.S. Cl.
CPC ........ *H01L 29/518* (2013.01); *H01L 29/6653* (2013.01); *H01L 29/785* (2013.01)

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,608,065 B1* | 3/2017 | Bergendahl | H01L 27/0886 |
| 9,831,183 B2 | 11/2017 | Lin et al. | |
| 9,859,386 B2 | 1/2018 | Ho et al. | |
| 10,522,642 B2 | 12/2019 | Lee et al. | |
| 10,692,987 B2* | 6/2020 | Wang | H01L 29/6656 |
| 2015/0228754 A1 | 8/2015 | Sung | |
| 2016/0181143 A1 | 6/2016 | Kwon et al. | |
| 2017/0110476 A1* | 4/2017 | Ching | H01L 29/0847 |
| 2018/0053831 A1 | 2/2018 | Cheng et al. | |
| 2019/0043959 A1 | 2/2019 | Lee et al. | |
| 2019/0198635 A1 | 6/2019 | Zhang et al. | |
| 2019/0237560 A1 | 8/2019 | Cheng et al. | |
| 2020/0219758 A1 | 7/2020 | Cleemput et al. | |

FOREIGN PATENT DOCUMENTS

| | | |
|---|---|---|
| KR | 20150095044 A | 8/2015 |
| KR | 20160074306 A | 6/2016 |
| KR | 20190013342 A | 2/2019 |
| TW | 1636551 | 9/2018 |
| TW | 201834079 A | 9/2018 |
| TW | 201841258 A | 11/2018 |

OTHER PUBLICATIONS

Taiwan Office Action, dated Apr. 9, 2021, for Korean Intellectual Property Office Appl. No. 109133755, 6 pages.

* cited by examiner

TRANSISTOR SPACER STRUCTURES

BACKGROUND

In a semiconductor chip, parasitic capacitances can be formed in locations where conductive structures separated by a dielectric layer are formed in close proximity. The conductive structures can be, for example, lines, vias, contacts, gate structures, or epitaxial layers. A method to avoid parasitic capacitances in densely packed chip layouts is to employ insulating materials with a reduced dielectric constant.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
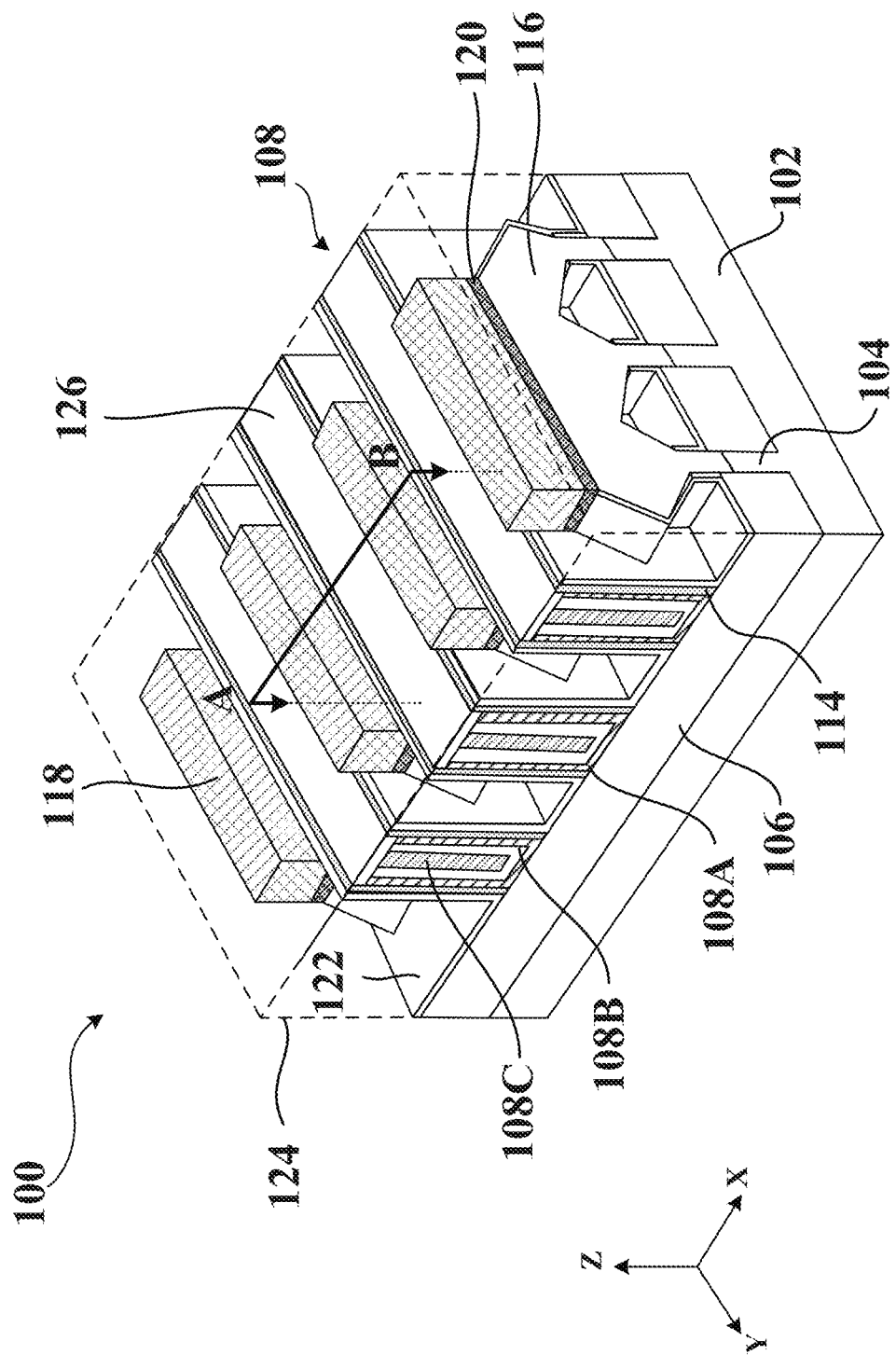
FIG. 1 is an isometric view of fin field-effect transistor (finFET) structures in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

The term "vertical," as used herein, means nominally perpendicular to the surface of a substrate.

Semiconductor chips can feature large transistor densities per unit area to increase chip functionality and to lower fabrication cost. However, semiconductor chips with large transistor densities can suffer from parasitic capacitances due to conductive structures—such as transistor gates, contacts, vias, and lines—being spaced closer together. For example, in a front-end-of-the-line (FEOL) area of the chip, unwanted parasitic capacitances can be formed between the transistor gate structures and adjacent source/drain (S/D) contacts, between the transistor gate structures and the S/D terminals, between the S/D contacts, and between the transistor gates.

To address the parasitic capacitance issues, the present disclosure is directed to a method for forming gate spacer structures having air-gaps that minimize an effective dielectric constant of the gate spacer structure, thus reducing the parasitic capacitance between the transistor gate structures and adjacent S/D contacts. In some embodiments, the air-gaps are formed by forming a gate spacer stack with a sacrificial spacer disposed between two spacer layers of the gate spacer stack, selectively removing the sacrificial spacer from the gate spacer stack to form an opening between the remaining spacer layers, etching a top portion of the opening to form a tapered profile, and subsequently plugging the etched top portion of the opening with a sealing material to form a permanent air-gap within the gate spacer structure. In some embodiments, forming the tapered profile includes using a ribbon beam etcher to perform one or more cycles of polymer material deposition and spacer layer etching. The deposited polymer material is configured to function as an etching mask during the etching operation to protect structural elements not intended to be etched. In some embodiments, multiple polymer deposition and etching cycles are possible until the desired opening profile is achieved. In some embodiments, the deposited polymer material and the etching chemistry can be selected to achieve optimal etch selectivity between the polymer material and the spacer layers of the gate spacer stack.

According to some embodiments, FIG. 1 is a partial isometric view of fin field-effect transistor (finFET) structures 100 built over substrate 102 on fins 104. FIG. 1 shows selective portions of finFET structures 100 and other portions may not be shown for simplicity. These other portions may include additional structural elements such additional layers, additional transistors, doped regions, isolation regions, and the like. Further, finFET structures 100 in FIG. 1 are shown for illustration purposes and may not be drawn to scale.

As shown in FIG. 1, FinFET structures 100 are formed on semiconductor fins 104 (also referred to as "fins 104"). Fins 104 are formed perpendicular to the top surface of substrate 102 and are electrically isolated from one another via isolation regions 106. Fins 104 may be patterned by any suitable method. For example, fins 104 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in an embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin 104. In some embodiments, isolation regions 106 are filled with a dielectric material, such as silicon oxide or a silicon-based oxide, and form shallow trench isolation (STI) regions between fins 104.

In some embodiments, substrate 102 and fins 104 include (i) silicon, (ii) a compound semiconductor such as gallium arsenide (GaAs), gallium phosphide (GaP), indium phosphide (InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof. For example purposes, substrate 102 and fins 104 will be described in the context of crystalline silicon. Based on the disclosure herein, other materials, as discussed above, can be used. These other materials are within the spirit and scope of this disclosure.

FinFET structures 100, as shown in FIG. 1, include gate structures 108, which wrap around the top and sidewall surfaces of fins 104; spacer structures 114, which are disposed on sidewall surfaces of gate structures 108; and source/drain ("S/D") epitaxial structures 116, which are grown on recessed portions of fins 104 not covered by gate structures 108 and spacers structures 114. Additional gate structures, not shown in FIG. 1, may be disposed adjacent to S/D epitaxial structure 116 of gate structures 108.

In FIG. 1, S/D epitaxial structures 116 from adjacent fins 104 are merged to a single epitaxial structure. However, this is not limiting, and S/D epitaxial structures 116 grown on fins 104 may remain un-merged. In some embodiments, merging one or more S/D epitaxial structures facilitates the formation of conductive structures 118. In some embodiments, a silicide layer 120 is grown between conductive structure 118 and S/D epitaxial structure 116 to reduce contact resistance. In some embodiments, S/D epitaxial structures 116 include boron-doped silicon-germanium (SiGe) epitaxial layers for p-type finFET structures 100, carbon-doped silicon (Si:C) or phosphorous-doped silicon (Si:P) epitaxial layers for n-type finFET structures 100.

According to some embodiments, each of gate structures 108 includes multiple layers, such as gate dielectric 108A, work function layers 108B, and metal fill 108C. Gate structures 108 may also include additional layers not shown in FIG. 1 for simplicity. These layers can include interfacial dielectric layers interposed between fin 104 and gate dielectric 108A, capping layers and barrier layers disposed between gate dielectric 108A and work-function layers 108B, and additional barrier layers between work-function layers 108B and metal fill 108C.

In some embodiments, gate dielectric 108A includes a high-k dielectric such as hafnium-based oxide; work-function layers 108B includes a stack of metallic layers such as titanium nitride, titanium-aluminum, titanium-aluminum carbon, etc.; and metal fill 108C includes a metal and liners such as tungsten and titanium nitride.

Figure 3:
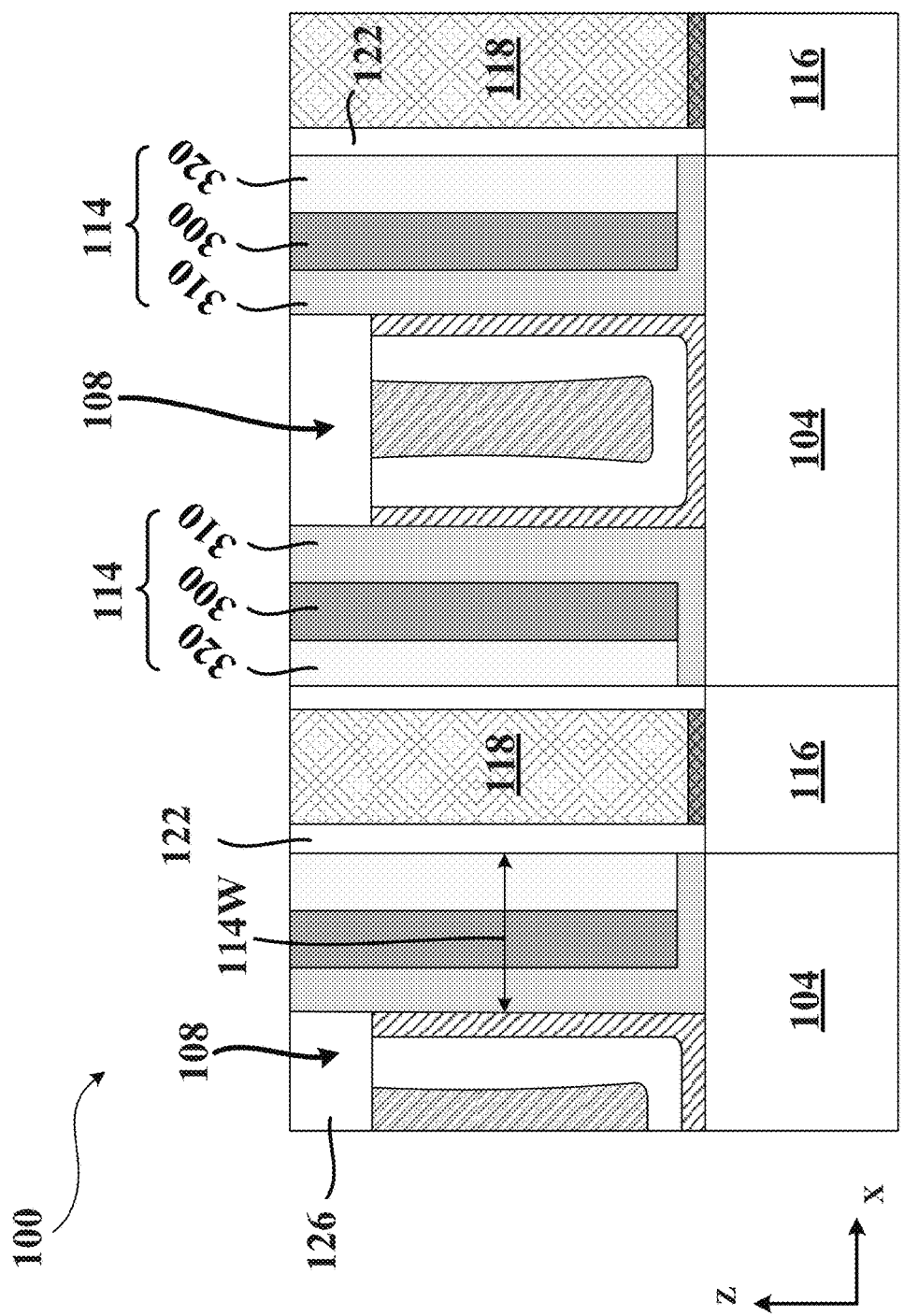
FIG. 3-10 are cross-sectional views of fin field-effect transistor (finFET) structures during the formation of gate spacer structures with air-gaps or voids therein in accordance with some embodiments.

In some embodiments, gate structures 108, spacer structures 114, and S/D epitaxial structures 116 are covered by capping layer 122 and surrounded by a dielectric layer 124 represented by a dashed line in FIG. 1. In some embodiments, spacer structures 114 electrically isolate gate structures 108 from S/D epitaxial structures 116 while capping layer 122 further isolates silicide layer 120, and conductive structures 118 from gate structures 108 as shown in FIG. 1 and FIG. 3—a cross-sectional view of FIG. 1 across cut-line AB.

Figure 11:
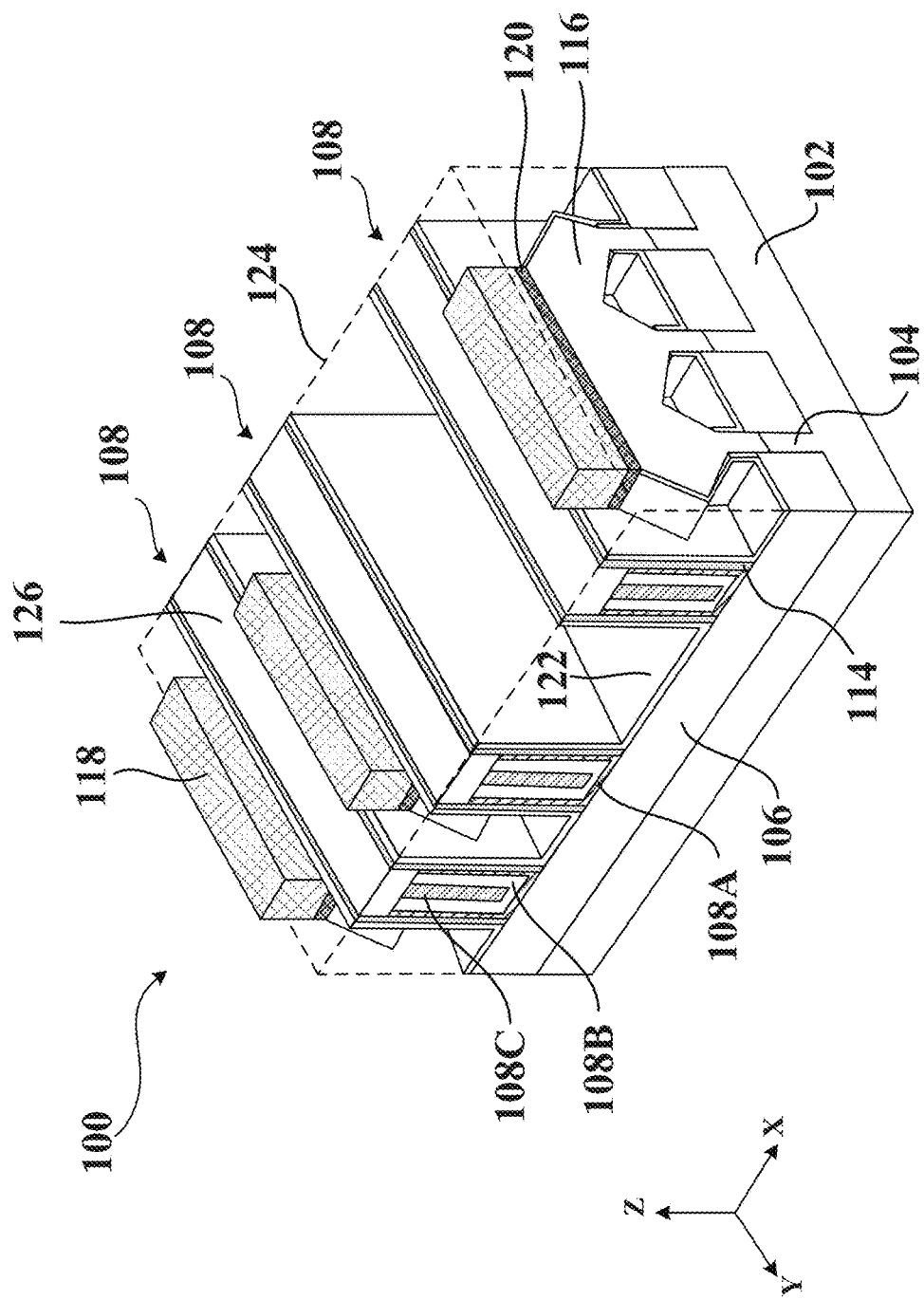
FIG. 11 is an isometric view of fin field-effect transistor (finFET) structures in accordance with some embodiments.

In some embodiments, variations of finFET structures 100 may exist and are within the spirit and the scope of this disclosure. For example, adjacent gate structures 108 may be spaced apart by dielectric layer 124 as opposed to a S/D epitaxial structure 116, as shown in FIG. 11. In other embodiments, capping layer 122 may be an optional layer.

In some embodiments, parasitic capacitances can be formed between two neighboring gate structures separated by dielectric layer 124, spacer structures 114, and capping layer 122. Parasitic capacitances may also be formed between a gate structure 108 and its respective conductive structure 118 or S/D epitaxial structure 116. Based on the parallel plate capacitance formula, the shorter the distance between gate structures 108 and other conductive elements of finFET structures 100, the higher the parasitic capacitance.

$$C = k\varepsilon_o \frac{A}{d},$$

where C is the capacitance of the parasitic capacitor, k is the dielectric constant of the insulator between the capacitor's plates (e.g., electrodes), $\varepsilon_o$ is the dielectric constant of free space, A is area of the plates, and d is the distance between the plates.

In some embodiments, gate structures 108 are recessed with respect to spacer structures 114 to facilitate the formation of a gate capping layer 126 which protects gate structure 108 during the formation of the openings for conductive structures 118. In some embodiments, gate capping layer 126 includes a nitride layer, such as silicon nitride.

Figure 2:
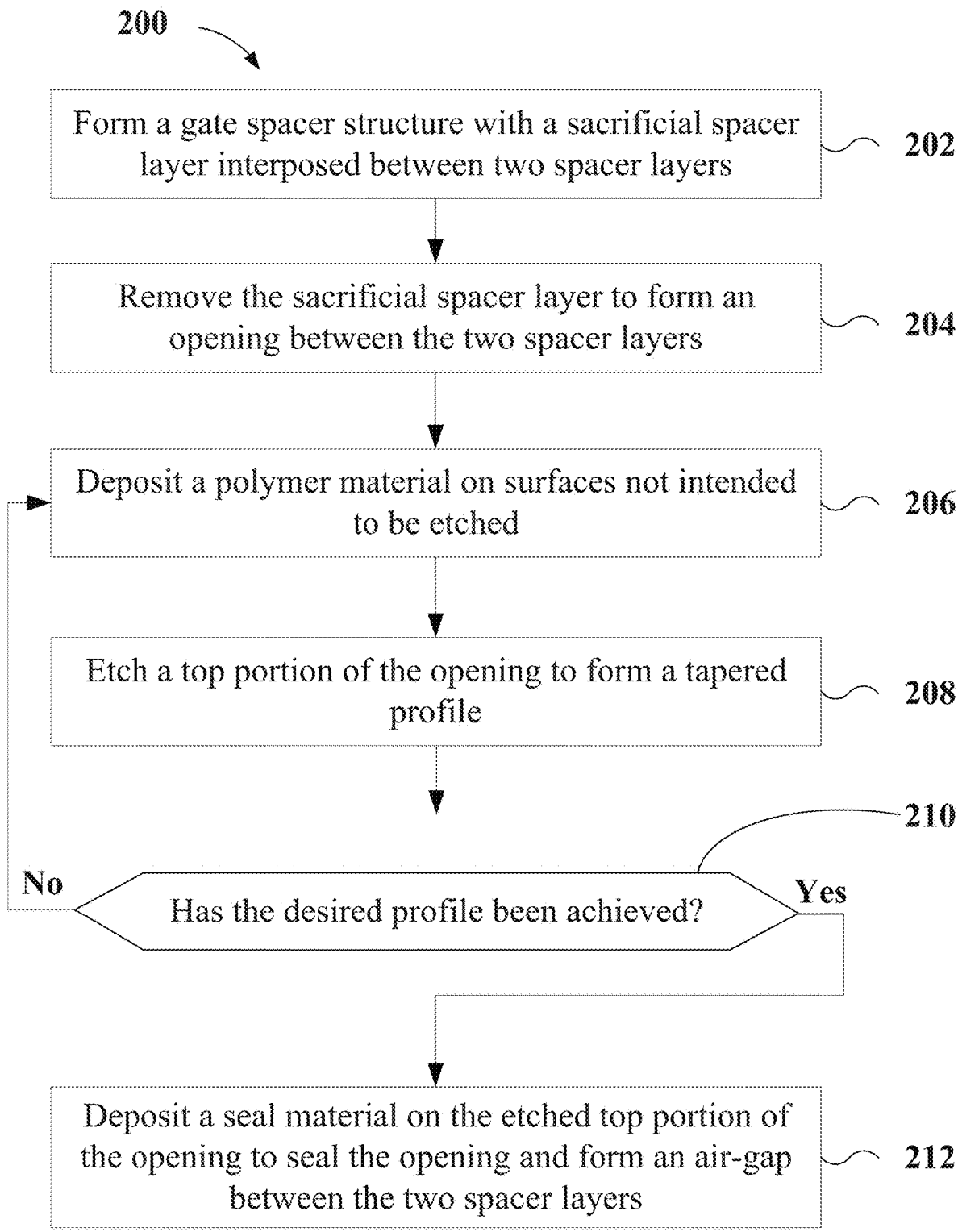
FIG. 2 is a flow chart of a method for forming a gate spacer structures with air-gaps or voids therein in accordance with some embodiments.

In some embodiments, FIG. 2 is a flow chart of a method 200 for forming air-gaps or voids in spacer structures 114 of finFET structure 100 shown in FIG. 1. According to some embodiments, spacer structures with air-gaps or voids have a reduced effective dielectric constant and can result in a lower parasitic capacitance. Other fabrication operations may be performed between the various operations of method 200 and are omitted merely for clarity. By way of example and not limitation, method 200 will be described in reference to FIGS. 3-10.

In referring to FIG. 2, method 200 begins with operation 202 and the process of forming a gate spacer structure with a sacrificial spacer layer interposed between two spacer layers. By way of example and not limitation, spacer structure 114 shown in FIGS. 1 and 3 can be a stack that includes a sacrificial spacer layer 300 sandwiched between "inner" spacer layer 310 and "outer" spacer layer 320. In some embodiments, sacrificial spacer layer 300 is removed (e.g., etched) in a subsequent operation of method 200.

By way of example and not limitation the sacrificial spacer layer 300 includes boron-doped silicon (Si:B) or boron-doped silicon-germanium (SiGe:B) material. In some embodiments, inner spacer layer 310 includes a low-k material (e.g., with a k-value lower than about 3.9), such as silicon oxy-carbon nitride (SiOCN) or silicon oxy-carbide (SiOC). By way of example and not limitation, outer spacer layer 320 includes silicon nitride (Si3N4, also referred to as "SiN").

In some embodiments, spacer structure 114 can be formed as follows. Initially, inner spacer layer 310, sacrificial spacer layer 300, and outer spacer layer 320 are successively blanket deposited as a stack over sacrificial gate structures, which are not shown in FIG. 1 as they will be replaced by gate structure 108 during a "metal gate replacement process." Subsequently, the deposited stack is etched with an anisotropic etching process that selectively removes the deposited stack from horizontal surfaces of the sacrificial gate structures, such as the top surfaces of the sacrificial gate structures, to form spacer structure 114. Alternatively, inner spacer layer 310 and sacrificial spacer layer 300 may be deposited first, followed by an anisotropic etching process that removes portions of sacrificial spacer layer 300, followed by the deposition of outer spacer layer 320, and followed by an anisotropic etching process that removes portions of outer spacer layer 320 to form spacer structure 114. The later fabrication sequence will form the "L-shaped" inner spacer layer 310 shown in FIGS. 3-5, and 7-10.

After forming spacer structure 114, a metal gate replacement process is subsequently performed to replace each sacrificial gate structure with a gate structure 108. The sacrificial gate structures are removed with a wet etching process. Doping sacrificial spacer layer 300 with boron prevents removal of sacrificial spacer layer 300 during the metal gate replacement process.

As discussed above, spacer structure 114 is formed prior to the formation of gate dielectric 108A, work function layers 108B, and metal fill 108C of gate structures 108. In some embodiments, each of the inner, sacrificial, and outer spacer layers are deposited with a thickness between about 2 nm and about 3 nm. Consequently, each spacer structure 114 can have a width 114W between about 6 nm and about 9 nm. Thinner or thicker spacer layers are possible and are within the spirit and the scope of this disclosure.

Figure 4:
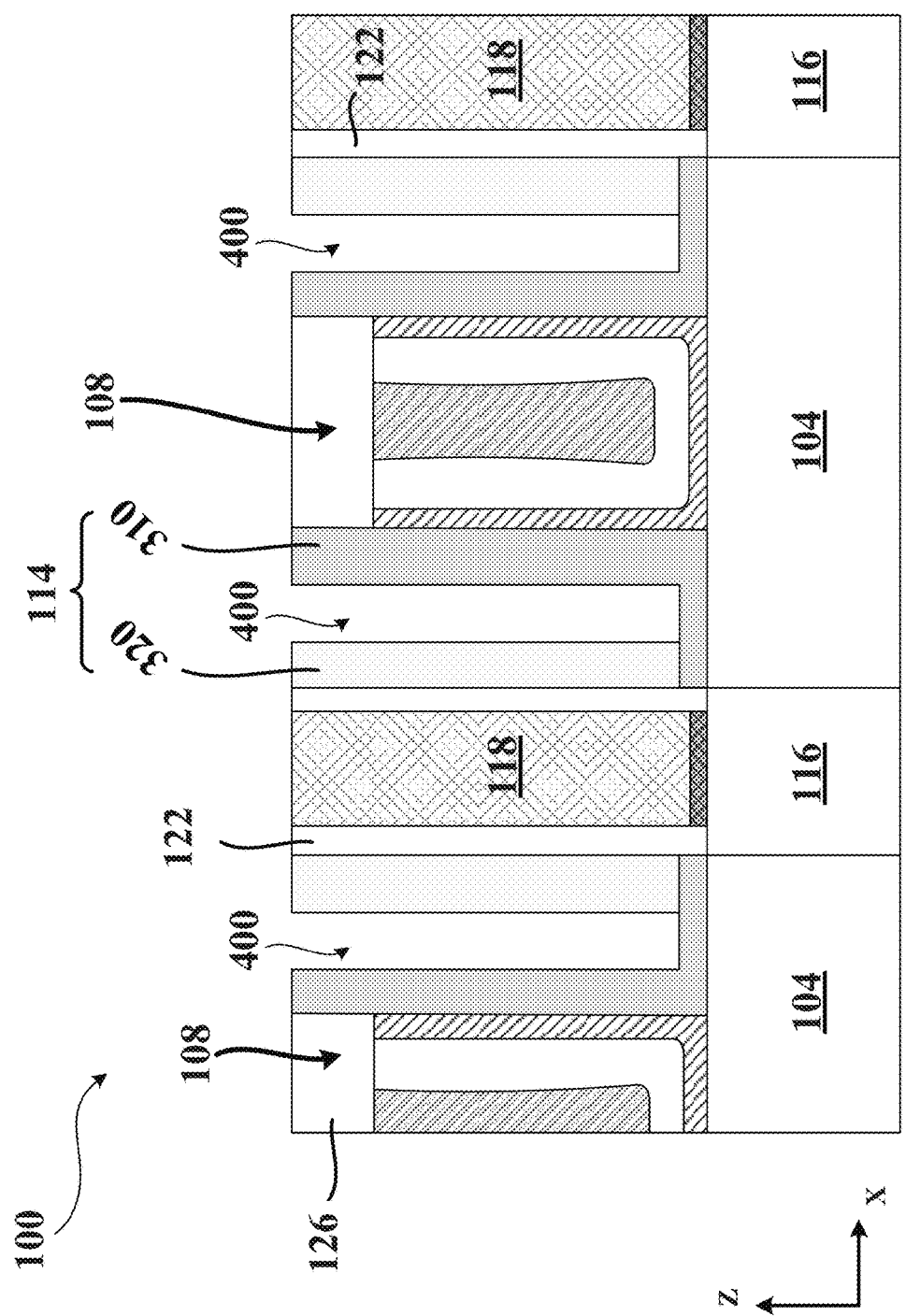

In referring to FIG. 2, method 200 continues with operation 204 and the process of removing sacrificial spacer layer 300 to form an opening between inner spacer layer 310 and outer spacer layer 320. By way of example and not limitation, inner spacer layer 310 is removed with a dry etching process using a mixture of hydrogen and fluorine or a gas chemistry that is highly selective towards sacrificial spacer layer 300 and least selective towards inner spacer layer 310 and outer spacer layer 320. The resulting structure is shown in FIG. 4. The removal of sacrificial spacer layer 300 leaves spacer openings in spacer structure 114 between inner spacer layer 310 and outer spacer layer 320. In some embodiments, spacer opening 400 has a width that ranges between 2 nm and 3 nm corresponding to the thickness of the etched sacrificial spacer layer 300. In some embodiments, the L-shaped inner spacer layer 310 protects fin 104 during the removal of sacrificial spacer layer 300. For example, if fin 104 was not protected, it would have been partially etched by the dry etching chemistry used to remove sacrificial spacer layer 300.

Figure 5:
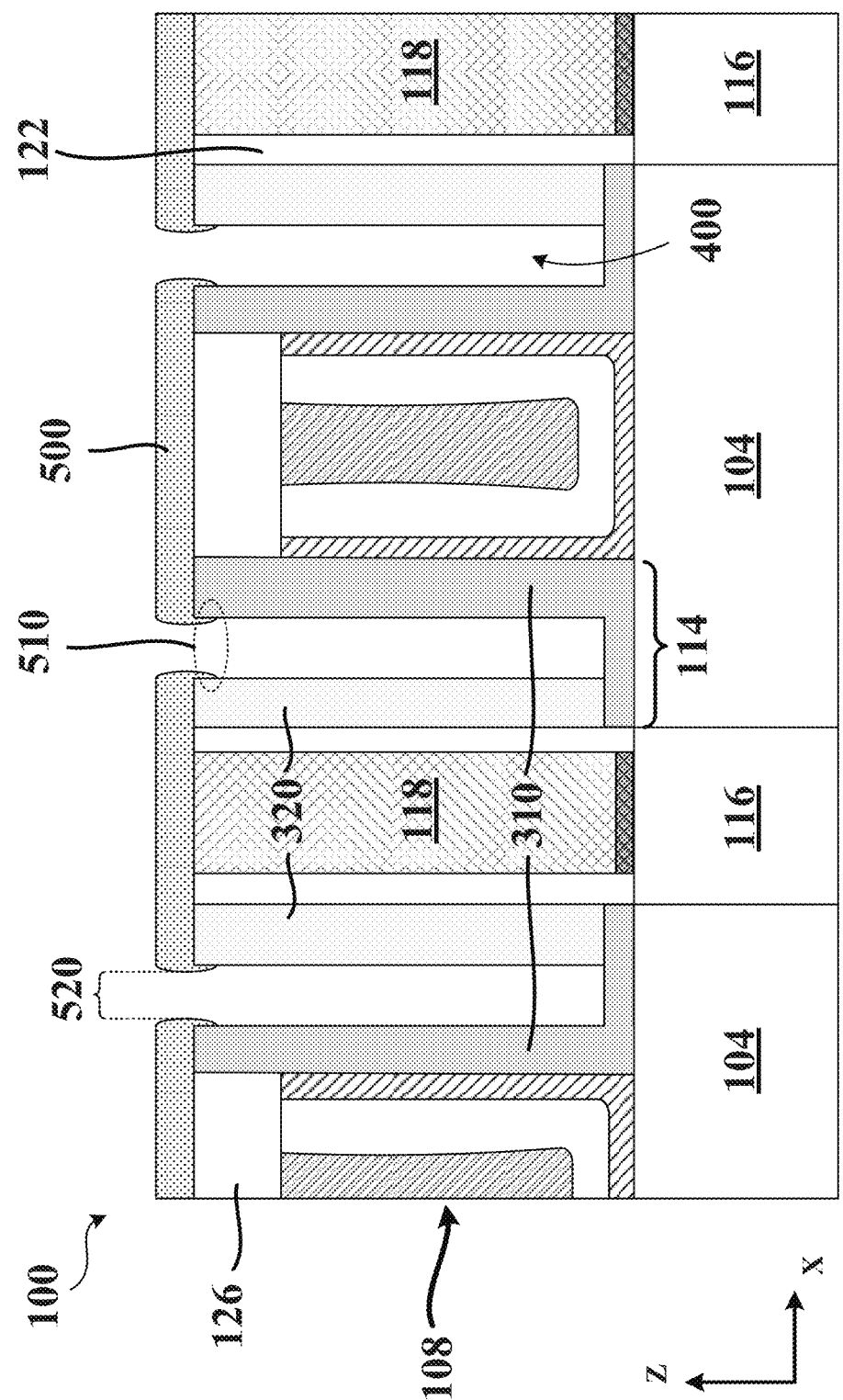

In referring to FIG. 2, method 200 continues with operation 206 and the process of depositing a polymer material on surfaces not intended to be etched, such as top surfaces of inner spacer layer 310, outer spacer layer 320, capping layer 122, gate capping layer 126, and conductive structure 118. In other words, the polymer material functions as an etching mask during a subsequent etching process. By way of example and not limitation, FIG. 5 shows finFET structures 100 after the deposition of polymer material 500 according to operation 206. In some embodiments, polymer material 500 is deposited primarily on horizontal surfaces of finFET structures 100 with a thickness between about 0.5 nm and about 1 nm. In some embodiments, a top portion of vertical sidewalls 510 of spacer openings 400 is coated with a thin layer of polymer material that is about half of that on the horizontal surfaces. For example, polymer material 500 on top portions of vertical sidewalls 510 of spacer openings 400 can be between about 0.25 nm and about 0.5 nm thick.

Figure 6:
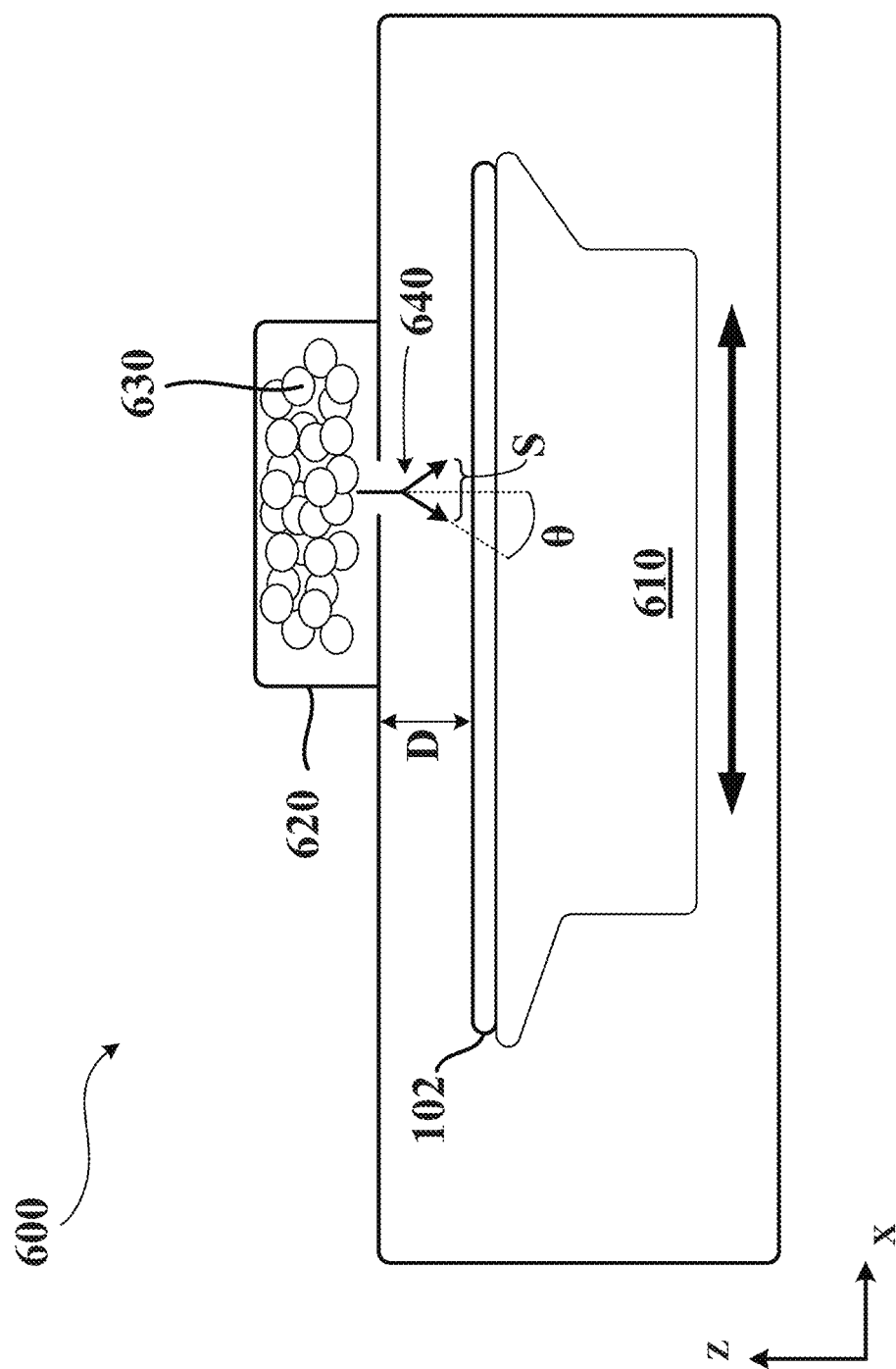

In some embodiments, polymer material 500 is deposited in a ribbon beam etcher 600—a cross section of which is shown in FIG. 6. By way of example and not limitation, ribbon beam etcher 600 may include a substrate stage 610, on which substrate 102 (e.g., shown in FIG. 1) rests during the polymer material deposition process. In some embodiments, substrate stage 610 is coupled to an external power supply (not shown in FIG. 6) configured to apply a voltage to substrate 102. Ribbon beam etcher 600 may also include a plasma chamber 620 disposed over substrate 102. Ribbon beam etcher 600 may include additional components not shown in FIG. 6. By way of example and not limitation, components not shown in FIG. 6 include gas lines, external power supplies, magnetic elements, mechanical and electrical components, computers, sensors, pumps, etc.

In some embodiments, a fluorocarbon gas e.g., methane (CH4), hexafluoro-2-butyne (C4F6), octafluorocyclobutane (C4F8), or fluoromethane (CH3F)), tetrachlorosilane (SiCl4), or sulfur dioxide (SO2) diluted in argon (Ar), nitrogen (N2), helium (He), or hydrogen (H2) and mixed with oxygen (O2) is introduced in plasma chamber 620 to generate plasma 630. Ions from plasma 630 are extracted through an aperture (e.g., ion extraction optics) to form a dual ion beam 640, which is subsequently accelerated towards substrate 102. In some embodiments, dual ion beam 640 includes a pair of ion beams each tilted from a direction normal to the top surface of substrate 102 by an angle θ as shown in FIG. 6. In some embodiments, angle θ (also referred to as "beam angle θ" or "tilt angle θ") is between about 1.3° and about 9°. According to some embodiments, dual ion beam 640 interacts with the exposed surfaces of substrate 102 to form polymer material 500 (e.g., CxHy) shown in FIG. 5. In some embodiments, the extraction voltage (e.g., the voltage applied to the substrate required to extract ions from plasma 630 and to form dual ion beam 640) is equal to or less than about 0.5 Kv (e.g., between about 0 kV and about 0.5 kV). According to some embodiments, the extraction voltage is a pulsed direct current (PDC) voltage (e.g., consisting of rectangular pulses).

By way of example and not limitation, during the polymer deposition process, the vertical distance D between the aperture of plasma chamber 620 and the top surface of substrate 102 is set between about 12 nm and about 16 nm. Since plasma chamber 620 can be stationary, substrate stage 610 can be configured to move in the x-y plane to achieve uniform deposition of polymer material 500 across the entire surface of substrate 102. In some embodiments, vertical distance D can be used to modulate beam separation S of dual ion beam 640 on the surface of substrate 102. For example, a short vertical distance (e.g., 7 nm) produces a small beam separation S on the surface of substrate 102. In contrast, a large vertical distance (e.g., 20 nm) produces a large beam separation S on the surface of substrate 102.

In some embodiments, the extraction voltage, beam angle θ, and vertical distance D are some of the parameters used to modulate aspects of the polymer material deposition, such as the deposition rate and the thickness of polymer material 500 on top portions of vertical sidewalls 510. In some embodiments, $O_2$ incorporated in the gas mixture is used as an additional parameter to control the deposition rate of polymer material 500. For example, addition of $O_2$ can reduce the deposition rate of polymer material 500. Further, the different type of fluorocarbon gases (e.g., $CH_4$, $C_4F_6$, $C_4F_8$, or $CH_3F$), $SiCl_4$ or $SO_2$ can be selected to produce polymer materials having different etchings rates for a given etching chemistry.

In some embodiments, after the deposition of polymer material 500 in operation 206, the top width 520 of spacer opening 400 is equal to or greater than about 1.5 nm (e.g., ≥1.5 nm). If top width 520 is less than about 1.5 nm (e.g., <1.5 nm), the formation of a tapered profile for spacer opening 400 can become challenging and may require additional processing.

Referring to FIG. 2, method 200 proceeds with operation 208 and the process of etching a top portion of spacer opening 400 to form a tapered profile. In some embodiments operation 208 includes etching the exposed sidewall portions of inner and outer spacer layers 310 and 320 to form a funnel-shaped top opening. In some embodiments, the etching operation is performed in ribbon beam etcher 600 shown in FIG. 6. For example, after the deposition of polymer material 500, an etching chemistry is introduced into plasma chamber 620 to produce a plasma, like plasma 630, from which ions can be extracted to form an ion beam, like dual ion beam 640, that selectively etches portions of inner and outer spacer layers 310 and 320 not covered by polymer material 500. In some embodiments, the etching chemistry—which is different from the deposition chemistry used for polymer material 500—includes tetrafluoromethane ($CF_4$) or fluoroform ($CHF_3$) diluted in Ar, $N_2$, He, or $H_2$ and mixed with $O_2$. In some embodiments, the etching chemistry and the polymer material deposition chemistry are selected based on the desired selectivity between polymer material 500 (e.g., the etching mask) and the materials to be etched (e.g., exposed portions of inner and outer spacer layers 310 and 320).

In some embodiments, the above mentioned etching chemistry is configured to etch polymer material 500 at a lower etch rate than exposed portions of inner and outer spacer layers 310 and 320. Therefore, during operation 208, the thickness of polymer material 500 on horizontal surfaces of finFET structures 100 is reduced and polymer material 500 on top portion of vertical sidewalls 510 of spacer opening 400 is consumed (e.g., etched).

In some embodiments, during the etching process of operation 208, beam angle θ is set between about 5° and about 30° while vertical distance D is set between about 6 nm and about 12 nm. Beam angle θ combined with vertical distance D can produce different etch profiles for spacer opening 400. For example, a wide beam angle θ (e.g., about 30°) combined with a short vertical distance D (e.g., about 7 nm) provide a shallow and more tapered etch profile compared to a narrow beam angle θ (e.g., about 1.3°) combined with a larger vertical distance D of about 16 nm. In some embodiments, the directionality of dual ion beam 640 delivers ions to the desired areas of inner and outer spacer layers 310 and 320 to be etched. For example, beam angle θ and distance D can be configured so that dual ion beam 640 is directed to top portions of vertical sidewalls 510 of spacer opening 400. During the etching, dual ion beam 640 initially removes polymer material 500 covering the top portions of vertical sidewalls 510 of spacer openings 400, and then begins to etch portions of inner and outer spacer layers 310 and 320 exposed to the direct path of dual ion beam 640. The resulting structure with a tapered profile 700 (also referred herein as "funnel 700") is shown in FIG. 7.

In some embodiments, the above mentioned etching process for inner and outer spacer layers 310 and 320 is referred to as "pull back."

Figure 7:
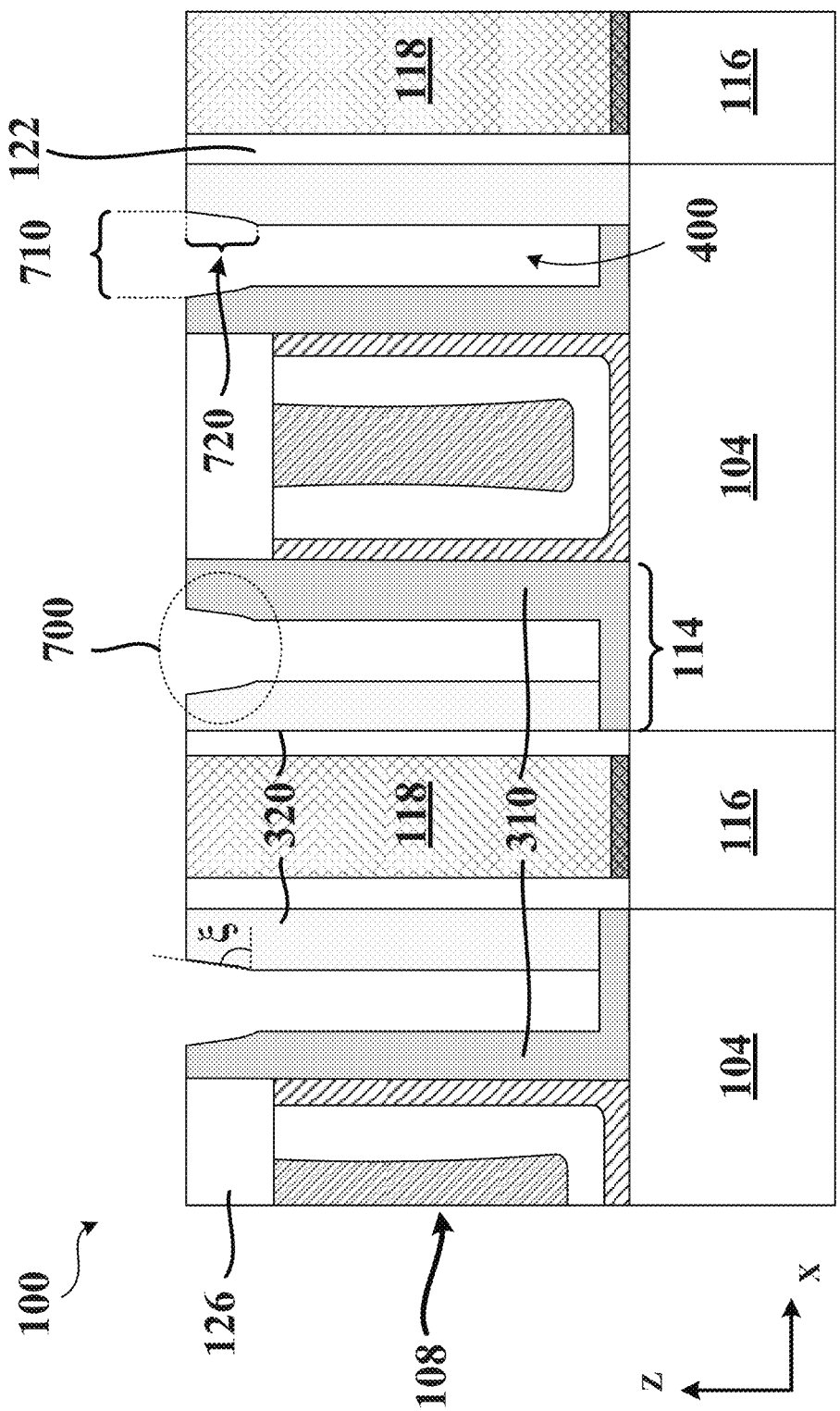
Figure 8:
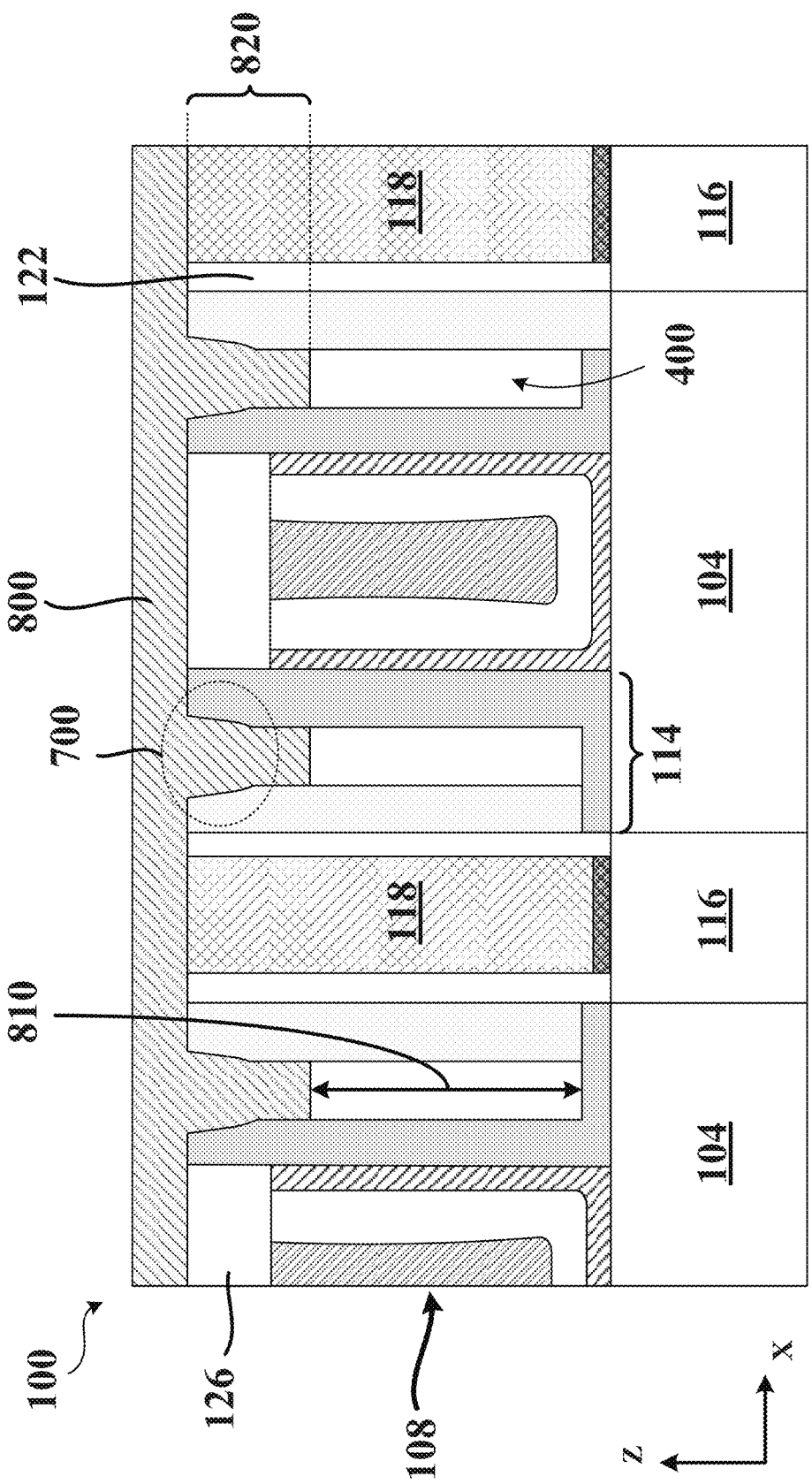

In some embodiments, as a result of the etching process in operation 208, tapered profile or funnel 700 develops a sidewall angle ξ ranging between about 70° and 80° measured from horizontal axis x as shown in FIG. 7. Further, tapered profile or funnel 700 has a top opening 710 between about 4.5 nm and about 5.5 nm, and a depth 720 between about 5 nm and about 9 nm.

In some embodiments, operations 206 and 208 may be repeated as necessary to achieve the desired profile for spacer opening 400 in spacer structure 114. For example, referring to FIG. 2, following operation 208 is checkpoint operation 210. According to operation 210, if the desired profile has not been achieved, a fresh layer of polymer material 500 may be deposited according to operation 206, followed by another etching process according to operation 206. On the other hand, if the desired profile has been achieved, then method 200 proceeds to operation 212. In some embodiments, process parameters for the deposition and etching operations 206 and 208 respectively can be re-adjusted when repeated to achieve the desired tapered profile. For example, beam angle θ, distance D, and the extraction voltage in etcher 600 can be adjusted accordingly when operations 206 and 208 are repeated.

In referring to FIG. 2, method 200 continues with operation 212 and the process of depositing a seal material on the etched top portion of spacer opening 400 to plug spacer opening 400 and form an air-gap between the two spacer layers (e.g., inner and outer spacer layers 310 and 320). For example, referring to FIG. 8, seal material 800 is deposited over finFET structures 100 and fills funnel 700. In some embodiments, seal material 800 includes silicon oxycarbide (SiOC) deposited at a temperature between about 300° C. and about 400° C. with plasma-enhanced chemical vapor deposition (PECVD) or a plasma-assisted atomic layer deposition (PEALD). In some embodiments, seal material 800 includes between about 25 atomic percentage (at. %) and about 40 at. % silicon, between about 25 at. % and about 50 at. % oxygen, and between about 4 at. % and about 40 at. % carbon. Further, seal material 800 has a dielectric constant less than about 4 (e.g., 3.6) to reduce the impact on the parasitic capacitance. In some embodiments, the as-deposited seal material 800 is subjected to a post-deposition annealing at about 400° C. in $N_2$ or $H_2$ for densification purposes. The deposition rate of seal material 800 can be configured so that reactant gases do not have sufficient time to reach deep into spacer opening 400 and form seal material 800 at the bottom of spacer opening 400. In some embodiments, seal material deposits at the bottom of the funnel form a necking point that prevents reactants from reaching further into spacer opening 400 form seal material 800 at the bottom of spacer opening 400.

In some embodiments, seal material 800 is deposited at a thickness greater than about 11 nm to sufficiently fill funnel 700. In some embodiments, seal material 800 is deposited to a depth 820 within spacer opening 400 that ranges between about 7 nm and 11 nm. The resulting air-gaps or voids have a height 810 between about 40 nm and about 70 nm, and a width that is substantially equal to the thickness of the removed sacrificial spacer layer 300 (e.g., between about 2 nm and about 3 nm).

In some embodiments, tapered profiles or funnels 700 with a depth less than about 5 nm and a top opening 710 less than about 4.5 nm may result in limited seal material formation inside funnels 700. Consequently, slurry from subsequent chemical mechanical planarization (CMP) processes may enter spacer opening 400 and erode spacer structure 114, which is undesirable. On the other hand, tapered profiles or funnels 700 with a top opening 710 wider than 5.5 nm can result in a reduced air-gap volume since seal material 800 can be deposited deeper into spacer opening 400. In situations where funnel 700 is very wide and deep (e.g., wider than about 5.5 nm and deeper than about 9 nm), seal material 800 may fill the entire spacer opening 400, which is not desirable because spacer structure 114 cannot take advantage of the air-gap or void formation with a low dielectric constant of 1.

Figure 9:
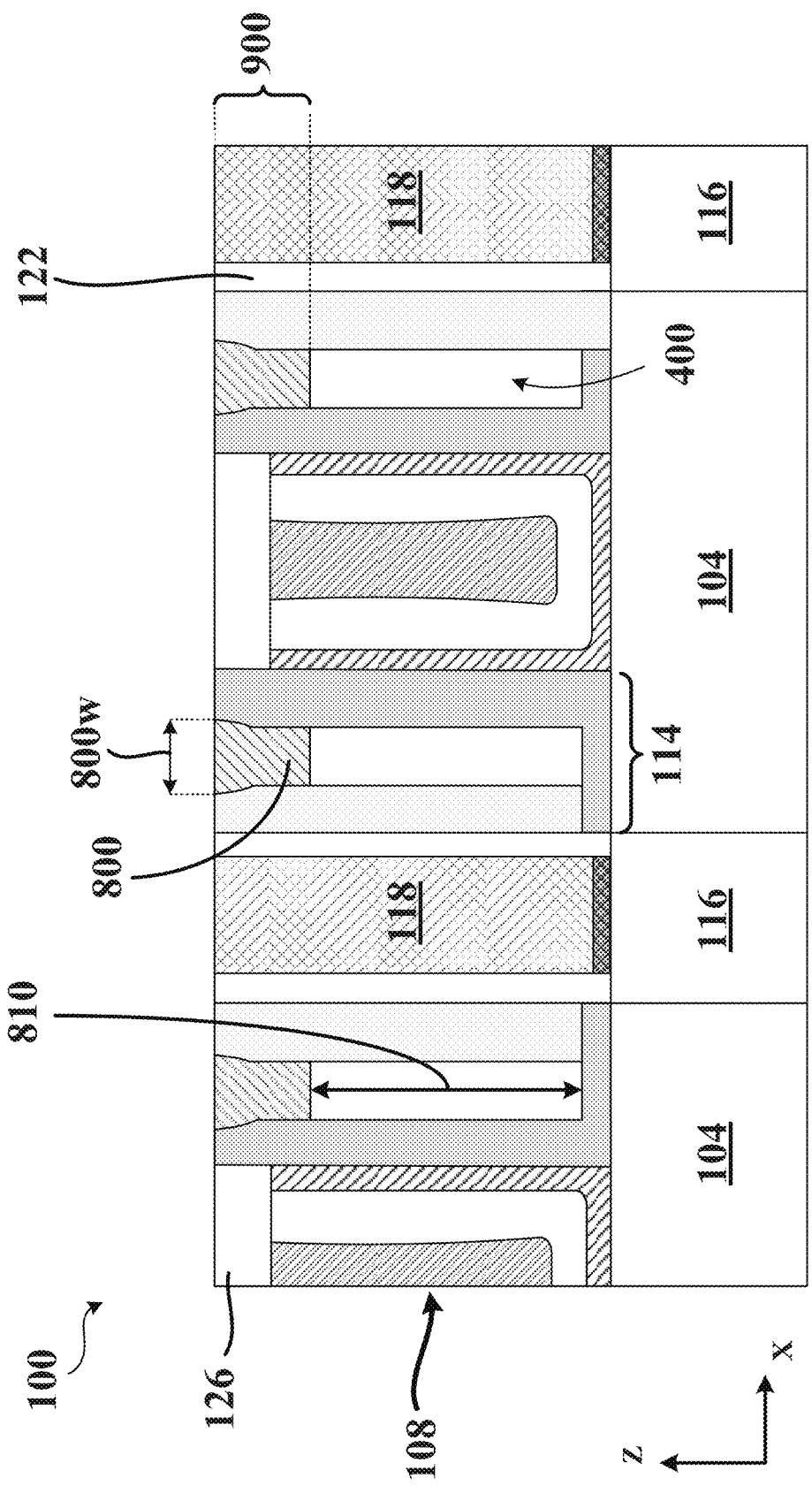

In some embodiments, after the deposition and thermal treatment of seal material 800, a CMP process removes excess seal material 800 outside spacer opening 400 as shown in FIG. 9. In some embodiments, the aforementioned CMP process reduces depth 820 to depth 900 from between about 7 nm and about 11 nm to about 4 nm. This is because the CMP process also removes portions of gate capping layer 126, portions of spacer structure 114, and portions of conductive structure 118. After the aforementioned CMP process, the top surface of finFET structures 100 is substantially planar. In some embodiments, after the aforementioned CMP process, seal material 800 has a top surface width 800w along the x-axis between about 3 nm and about 5.5 nm and a depth 900 between about 1 nm and about 4 nm. For example, an aspect ratio of seal material 800 ranges between about 0.2 and about 1.3; where the aspect ratio is defined as the ratio between depth 900 and surface width 800w. In some embodiments, seal material 800 occupies between about 5% and about 9% of spacer opening 400; the rest of the opening 400 is occupied by the air-gap or void. In some embodiments, the remaining seal material 800 has a funnel shape with its top surface being wider than its bottom surface. However, this is not limiting, and depending on the amount of seal material 800 removed during the aforementioned CMP process, width 800w of seal material 800 can be substantially equal to the width of spacer opening 400 (e.g., about 3 nm).

Figure 10:
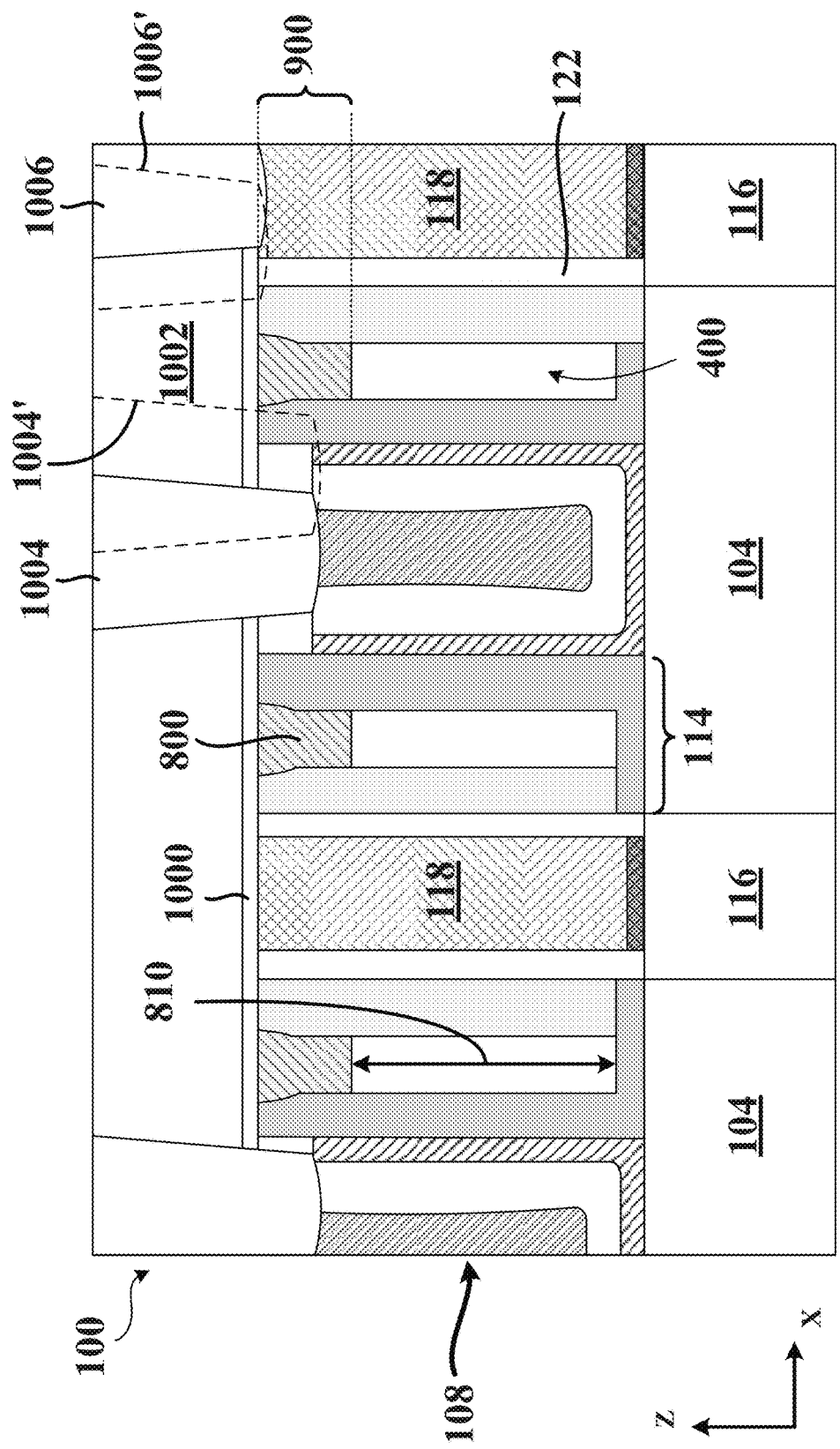

In referring to FIG. 10, additional conductive structures 1004 and 1006 can be formed on gate structures 108 and conductive structures 118, according to some embodiments. By way of example and not limitation, conductive structures 1004 and 1006 can be formed as follows: a metal-oxide etch stop layer (ESL) 1000 (e.g., aluminum oxide) and a dielectric layer 1002 (e.g., a silicon-based oxide) can be blanket deposited over finFET structures 100 as shown in FIG. 10. Subsequently, an etching process forms openings in dielectric layer 1002 and metal-oxide ESL 1000 substantially aligned to gate structures 108 and conductive structures 118. In some embodiments, a different etching chemistry is used to etch dielectric layer 1002 from metal-oxide ESL 1000. According to some embodiments, the etching chemistry used to etch metal-oxide ESL 1000 is configured to have a lower selectivity towards seal material 800 (e.g., SiOC), inner spacer layer 310 (e.g., SiN), outer spacer layer 320 (e.g., SiOC), and capping layer 122 (e.g., SiN). This can be beneficial when the openings for conductive structures 1004 and 1006 are unintentionally misaligned with respect to gate structures 108 and conductive structures 118, as shown by misaligned dashed lines 1004' and 1006'. With such misalignment, lower etching rates for seal material 800 (e.g., SiOC), inner spacer layer 310 (e.g., SiN), outer spacer layer 320 (e.g., SiOC), and capping layer 122 (e.g., SiN) can prevent the etching chemistry from substantially removing portions of these structures. Once the openings are formed, conductive material fills the openings to form conductive structures 1004 and 1006. In some embodiments, conductive structures 1004 and 1006, like conductive structure 118, include a metal fill such as tungsten, cobalt, or another suitable conductive material. In some embodiments, conductive structures 1004 and 1006, like conductive structure 118, include a liner or barrier layers such as titanium nitride, or a stack of titanium and titanium nitride deposited prior to the metal fill.

In some embodiments, method 200 is not limited to finFET structures 100 shown in FIG. 1 and may be applied to other types of transistors or variations of finFET structures 100 sensitive to parasitic capacitances. For example, method 200 can be applied to planar transistors and gate-all-around transistors. Further, method 200 can be applied to selective transistors in the chip—e.g., method can be applied to transistors in high density areas of the chip.

The present disclosure is directed to a method for forming gate spacer structures having air-gaps to minimize the effective dielectric constant of the gate spacer structure and to reduce the parasitic capacitance between the transistor gate structures and adjacent S/D contacts. In some embodiments, the air-gaps are formed by forming a gate spacer stack with a sacrificial spacer disposed between two spacer layers of the gate spacer stack, selectively removing the sacrificial spacer from the gate spacer stack to form an opening between the remaining spacer layers, etching a top portion of the opening to form a tapered profile, and subsequently plugging the etched top portion of the opening with a sealing material to form a permanent air-gap within the gate spacer structure adjacent to the gate structure. In some embodiments, forming the tapered profile includes using a ribbon beam etcher to perform one or more cycles of polymer material deposition and spacer layer etching. The deposited polymer material is configured to function as an etching mask during the etching operation to protect structural elements not intended to be etched. In some embodiments, multiple polymer deposition and etching cycles are possible until the desired opening profile is achieved. In some embodiments, the deposited polymer material and the etching chemistry can be selected to achieve optimal etch selectivity between the polymer material and the spacer layers of the gate spacer stack. Polymer material deposition and etching require different chemistries and ion beam characteristics, such as beam angle and ion energy. In some embodiments, the beam angle during the polymer material deposition is between about 1.3° and about 9° while the beam angle during the etching process is between 5° and about 30°. In some embodiments, the sealing material is a low-k dielectric that includes SiOC having between about 25 atomic percentage (at. %) and about 40 at. % silicon, between about 25 at. % and about 50 at. % oxygen, and between about 4 at. % and about 40 at. % carbon.

In some embodiments, a structure includes a gate structure on a fin, a capping layer on the gate structure, a conductive structure adjacent to the gate structure, and a spacer structure interposed between the gate structure and the conductive structure. The spacer structure further includes a first spacer layer in contact with sidewall surfaces of the gate structure and the capping layer, a second spacer layer spaced apart from the first spacer layer by a gap, and a seal layer disposed above the gap between the first spacer layer and the second spacer layer.

In some embodiments, a method includes forming a gate structure on a substrate and a spacer stack on sidewall surfaces of the gate structure—where the spacer stack includes an inner spacer layer in contact with the gate structure, a sacrificial spacer layer on the inner spacer layer, and an outer spacer layer on the sacrificial spacer layer. The method further includes removing the sacrificial spacer layer to form an opening between the inner and outer spacer layers, depositing a polymer material on top surfaces of the inner and outer spacer layers, etching top sidewall surfaces of the inner and outer spacer layers to form a tapered top portion, and depositing a seal material to plug the tapered top portion and form a gap between the inner and outer spacer layer.

In some embodiments, a structure includes a gate structure on a substrate, a conductive structure spaced apart from the gate structure, and a spacer structure interposed between the gate structure and the conductive structure. The spacer structure additionally includes a first spacer with first inner sidewall surfaces, a second spacer with second inner sidewall surfaces opposite to the first inner sidewall surfaces of the first spacer, a seal material disposed on a top portion of the spacer structure between the first and second inner sidewall surfaces, and a gap formed between the first and the second spacers surrounded by the first and second inner sidewall surfaces and the seal material.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a gate structure on a fin;
   a capping layer on the gate structure;
   a conductive structure adjacent to the gate structure; and
   a spacer structure interposed between the gate structure and the conductive structure, wherein the spacer structure comprises:
      a first spacer layer in contact with sidewall surfaces of the gate structure and the capping layer;
      a second spacer layer spaced apart from the first spacer layer by a gap; and
      a seal layer disposed above the gap between the first spacer layer and the second spacer layer.

2. The structure of claim 1, wherein the gap is surrounded by sidewall surfaces of the first and second spacer layers, a bottom portion of the first spacer layer, and the seal layer.

3. The structure of claim 1, wherein the seal layer fills top portions of sidewall surfaces of the first and second spacer layers.

4. The structure of claim 1, wherein top surfaces of the capping layer, the spacer structure, and the conductive structure are substantially co-planar.

5. The structure of claim 1, wherein the gap has a width between about 2 nm and about 3 nm and a height between about 40 nm and about 70 nm.

6. The structure of claim 1, wherein a width of the spacer structure is between about 6 nm and about 9 nm.

7. The structure of claim 1, wherein the first spacer layer comprises silicon oxy-carbon nitride, the second spacer layer comprises silicon nitride, and the seal layer comprises silicon oxycarbide.

8. The structure of claim 1, further comprising:
   a metal oxide etch stop layer disposed on the capping layer, the spacer structure, and the conductive structure;
   a dielectric layer on the metal oxide etch stop layer; and
   an other conductive structure on the gate structure, wherein the other conductive structure traverses through the capping layer, the metal oxide etch stop layer, and the dielectric layer.

9. A method, comprising:
   forming a gate structure on a substrate;
   forming a spacer stack on sidewall surfaces of the gate structure, wherein the spacer stack comprises:
      an inner spacer layer in contact with the gate structure;
      a sacrificial spacer layer on the inner spacer layer; and
      an outer spacer layer on the sacrificial spacer layer;
   removing the sacrificial spacer layer to form an opening between the inner and outer spacer layers;
   depositing a polymer material on top surfaces of the inner and outer spacer layers;
   etching top sidewall surfaces of the inner and outer spacer layers to form a tapered top portion; and
   depositing a seal material to plug the tapered top portion and form a gap between the inner and outer spacer layers.

10. The method of claim 9, wherein removing the sacrificial spacer layer comprises using a dry etching process to etch the sacrificial spacer layer.

11. The method of claim 9, wherein the sacrificial spacer layer comprises boron-doped silicon or boron-doped silicon germanium.

12. The method of claim 9, wherein depositing the seal material comprises depositing silicon oxy-carbide comprising between about 25 atomic percentage (at. %) and about 40 at. % silicon, between about 25 at. % and about 50 at. % oxygen, and between about 4 at. % and about 40 at. % carbon.

13. The method of claim 9, further comprising, after depositing the seal material, subjecting the seal material to a post deposition anneal at about 400° C. in nitrogen or hydrogen.

14. The method of claim 9, wherein etching the top sidewall surfaces of the inner and outer spacer layers comprises forming the tapered top portion with a sidewall angle between about 70° and 80°.

15. The method of claim 9, wherein depositing the polymer material comprises forming a spacing on a top portion of the openings equal to or greater than about 1.5 nm.

16. The method of claim 9, wherein depositing the polymer material comprises depositing the polymer material at a thickness between about 0.5 nm and about 1 nm.

17. A structure, comprising:
   a gate structure on a substrate;
   a conductive structure spaced apart from the gate structure; and
   a spacer structure interposed between the gate structure and the conductive structure, wherein the spacer structure comprises:
      a first spacer with first inner sidewall surfaces;
      a second spacer with second inner sidewall surfaces opposite to the first inner sidewall surfaces of the first spacer;

a seal material disposed on a top portion of the spacer structure between the first and second inner sidewall surfaces; and a gap formed between the first and the second spacers surrounded by the first and second inner sidewall surfaces and the seal material.

18. The structure of claim 17, wherein the gap has a width equal to a distance between the first and second inner sidewall surfaces of respective first and second spacers.

19. The structure of claim 17, wherein the gap has a height substantially equal to a distance between a bottom portion of the first spacer and a bottom portion of the seal material.

20. The structure of claim 17, wherein the top portion of the spacer structure filled with the seal material has a tapered shape.

* * * * *